United States Patent  (10) Patent No.: US 6,654,042 B2
Ikeda  (45) Date of Patent: Nov. 25, 2003

(54) SEMICONDUCTOR LASER ARRAY HAVING PLURAL LIGHT EMITTING ELEMENTS AND A LIGHT RECEIVING ELEMENT (75) Inventor: Yoshito Ikeda, Matsudo (JP)

(73) Assignee: Ricoh Company, Ltd., Tokyo (JP)

( * ) Notice: Subject to any disclaimer, the term of this patent is extended or adjusted under 35 U.S.C. 154(b) by 397 days.

(21) Appl. No.: 09/725,563

(22) Filed: Nov. 30, 2000

(65) Prior Publication Data

US 2001/0052925 A1 Dec. 20, 2001

(30) Foreign Application Priority Data

Nov. 30, 1999 (JP) .......................................... 11-341252

(51) Int. Cl.[7] .............................................. B41J 2/435
(52) U.S. Cl. ...................................... 347/237; 347/247
(58) Field of Search ................................ 347/139, 130, 347/236, 237, 246, 247, 132, 133; 250/205

(56) References Cited

U.S. PATENT DOCUMENTS

| 4,443,695 A | * | 4/1984 | Kitamura | ..................... 250/205 |
| 4,796,265 A | | 1/1989 | Asada et al. | ................... 372/31 |
| 4,855,767 A | * | 8/1989 | Sato et al. | ................... 347/129 |
| 5,892,219 A | | 4/1999 | Minakuchi et al. | ......... 250/205 |

FOREIGN PATENT DOCUMENTS

| EP | 0 710 005 | 5/1996 | ............ H04N/1/40 |
| EP | 0 902 586 | 3/1999 | ............ H04N/1/40 |

* cited by examiner

Primary Examiner—Hai Pham
(74) Attorney, Agent, or Firm—Oblon, Spivak, McClelland, Maier & Neustadt, P.C.

(57) ABSTRACT

An optical writing apparatus including a semiconductor laser having plural light emitting elements and a single light-receiving element and plural semiconductor laser drive controlling devices. The plural light emitting elements in the semiconductor laser array are driven such that an optical writing operation at a same time per each of plural lines is performed. A commonly used LD drive controlling circuit drives the LD array. An output timing-determining device outputs a switch changing-over signal to either one of respective changing-over switches in a changing-over switch circuit. After an operational delay time of the changing-over switch elapses, an APC signal is output to an APC control section of the LD drive controlling circuit connected to a negative feedback loop formed by a changing-over operation of the changing-over switch circuit. After the completion of the APC operation, the outputting of the switch changing-over signal to the changing-over switch is stopped.

10 Claims, 7 Drawing Sheets

SEMICONDUCTOR LASER ARRAY HAVING PLURAL LIGHT EMITTING ELEMENTS AND A LIGHT RECEIVING ELEMENT

CROSS-REFERENCE TO RELATED APPLICATIONS

This application claims priority under 35 USC §119 to Japanese Patent Application No. 11-341252, filed on Nov. 30, 1999, the entire contents of which is incorporated by reference herein.

BACKGROUND OF THE INVENTION

1. Field of the Invention

The present invention relates to an optical writing apparatus employed in an image forming apparatus, such as laser printer, digital copying machine, facsimile device, etc., and in particular to an optical writing apparatus in which an optical writing operation is performed by use of a semiconductor laser (e.g., laser diode) array.

2. Discussion of the Background

Recently, in an image forming apparatus, such as the digital copying machine, etc., an optical writing apparatus is provided. Such writing apparatus typically includes a single laser chip constructed with a light-emitting element (e.g., semiconductor laser), a light-receiving element (e.g., photodiode) and a semiconductor laser drive controlling circuit (e.g., a semiconductor laser drive controlling device). The semiconductor laser drive controlling circuit is used for driving the light-emitting element in the laser chip and causing the light-emitting element to perform the writing operation on a line-by-line basis.

In such an optical writing apparatus, the laser beam emitted from the light-emitting element in the single laser chip is periodically deflected by use of a polygon mirror rotated by a polygon motor. The surface of a photosensitive body rotated in a sub-scanning direction is scanned in a main scanning direction and image data is written on the surface thereof.

In the semiconductor laser drive controlling circuit (LD drive controlling circuit), a negative feedback loop is connected to the laser chip. Namely, a light-receiving signal output from the light-receiving element corresponding to the light-emitting level of the light-receiving element. An APC operation is performed such that the light-emitting amount of the light-emitting element is controlled to a constant value in accordance with the light-receiving signal output from the light-receiving element in the laser chip corresponding to the light-emitting level of the light-emitting element. In other words, the normal-direction current flowing through the light-emitting element is controlled so as to equalize the light-receiving signal output from the light-receiving element corresponding to the light-emitting level of the light-emitting element.

In the recent years, increasing of print speed (i.e., image forming speed), image quality, etc., has been desired. Accordingly, high-speed rotation of the polygon motor and high frequency image formation has been attempted. However, there are respective limitations in the speeding-up of such factors. In addition, it is difficult to technically achieve such results.

In order to address such the problems, the speeding-up of such factors has been implemented by utilizing a multiple beam laser. As one such example, an optical writing apparatus is provided with plural laser chips and plural LD drive controlling circuit for simultaneously driving the light-emitting elements in the respective laser chips and causing the light-emitting elements to perform the optical writing operation for plural lines. In such a structure, the images of the plural lines are simultaneously written on the surface of the photosensitive body.

In the above apparatus, the laser beams emitted from the light-emitting elements in the respective laser chips are respectively deflected periodically by use of a polygon mirror rotated by a polygon motor. In such a method, a positional difference is caused in the sub-scanning direction on the surface of the photosensitive body rotated in the sub-scanning direction, and the surface thereof is scanned in the main scanning direction. At this time, the image is written on the surface thereof by use of the multiple beams. According to the method of writing the image by use of such the multiple beams, the amount of the image, which can be written at the same time is increased, and thereby the number of revolutions of the polygon motor and the image frequency can be reduced. Consequently, the image can be processed with high speed and in a stable manner.

However, according to the method of writing the image by use of the aforementioned multiple beams, although the print speed is further increased and the image quality is further improved, the number of the laser chips has to be increased. In addition, the structural parts may become further complicated in order to adjust the pitch in the sub-scanning direction of the light-emitting point of the light-emitting elements in the respective laser chips. Furthermore, with such an apparatus, it is necessary to further raise up the speed of the synchronization detecting plate (e.g., synchronization detecting sensor) generating and outputting the synchronization detecting signal for prescribing the writing starting position (e.g., image starting position) in the main scanning direction by the image signal of each channel (CH) for modulating and driving (e.g., turning on/off) the respective light-emitting elements.

In order to realize further speed-up of printing and further improvement of the image quality, there has been proposed an LD array (e.g., a semiconductor laser array), which is a laser chip constructed with plural light-emitting elements and a single light-receiving element. In such an LD array, plural light-emitting elements are arranged in the main scanning direction (e.g., at almost a same position in the main scanning direction) with a predetermined pitch (e.g., at equal intervals). Since the adjustment between the pitches of the light-emitting points of the light-emitting elements is determined by the property of the lens in the optical system, it is possible to omit the complicated adjustment mechanism for adjusting the rotation, etc.

In addition, since the plural light-emitting elements are arranged in a row in the main scanning direction, a synchronization detection signal of either one of channels (CH) output from the synchronization plate can be commonly used. Therefore, a phase between the respective channels (CH) does not have to be controlled. Consequently, the problem to be solved of the synchronization detecting plate, that is, the problem of the response speed thereof can be eliminated.

SUMMARY OF THE INVENTION

The background art optical writing devices have been described above. However, according to such background art devices, there exists no advantageous functional effect for improving the above-mentioned optical writing apparatus. Accordingly, the present invention has been made in view of the above-discussed and other problems and solves the above-mentioned defects and problems of the background art devices.

Specifically, an object of the present invention is to provide an optical scanning apparatus that corrects the defects and problems of the background art devices. In this respect, since the LD array is of a peculiar structure composed of plural light-emitting elements and a single light-receiving element, there does not exist an LD drive controlling circuit exclusively used for such an LD array. Accordingly, when the LD array is employed, it is necessary to construct the control circuit in a discrete state.

In addition, at the present time, a cathode-common type LD array is typically used. Furthermore, as the LD drive controlling circuit for a cathode-common type LD array of one CH (e.g., an LD driver for use in one CH), many ICs including an APC function block (e.g., a circuit for performing an APC operation) have been proposed. The present invention has been made in consideration of the above-noted matters. In the optical writing apparatus, the LD array can be driven by use of a commonly-used existing LD drive controlling circuit, such as the LD driver for use in one CH (e.g., including the APC function block).

It is another object of the present invention to simplify the entire control circuit, stabilize the LD driving by use of the LD driving IC (e.g., an exclusively-used IC), and reduce the cost thereof.

In order to attain the above and other objects of the present invention, a first aspect of the present invention provides a novel optical writing apparatus, including a semiconductor laser array constructed with plural light-emitting elements and a single light-receiving element; and plural semiconductor laser drive controlling devices respectively and simultaneously driving the plural light-emitting elements in the semiconductor laser array and thereby causing the light-emitting elements to perform the optical writing operation at the same time per each of the plural lines. The plural semiconductor laser drive controlling devices respectively include a current controlling device controlling the normal-direction currents flowing through the respective plural light-emitting elements, such that the light-receiving signals corresponding to the light-emitting levels of the respective light-emitting elements output from the light-receiving element in the semiconductor laser array and the light-emitting level designating signals respectively become equal to each other. The optical writing apparatus further includes a change-over switching device capable of changing over the plural semiconductor laser drive controlling devices to either one of them as a negative feedback loop, to which the light-receiving signal output from the light-receiving element in the semiconductor laser array is applied. The writing apparatus further includes an output timing determination device respectively determining an output timing of the change-over signal to the change-over switching device and another output timing of the control starting signal to the current controlling device in the respective semiconductor laser drive controlling devices. The output timing determination device further includes an output device for outputting the change-over signal to the change-over switching device and for outputting the control starting signal to the current controlling device in the semiconductor laser drive controlling device connected to the negative feedback loop formed by the changing-over operation of the change-over switching device, after at least the time corresponding to the operation delaying time of the change-over switching device elapses from that time point.

In a second aspect of the present invention there is provided a novel optical writing apparatus including a semiconductor laser array constructed with plural light-emitting elements and a single light-receiving element and plural semiconductor laser drive controlling devices. The plural semiconductor laser drive controlling devices respectively include a current controlling device, light-receiving signals corresponding to the light-emitting levels of the respective light-emitting elements output from the light-receiving element in the semiconductor laser array and the light-emitting level designating signals respectively become equal to each other. The optical writing apparatus further includes a change-over switching device and an output timing determination device. The output timing determination device further includes an output stopping device for stopping the outputting of the change-over signal to the change-over switching device, after finishing the control operation by use of the current controlling device in the semiconductor laser drive controlling device connected to the negative feedback loop formed by the changing-over operation of the change-over switching device among the current controlling devices in the respective semiconductor laser drive controlling devices.

BRIEF DESCRIPTION OF DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

In describing the preferred embodiment of the present invention, illustrated in the accompanying drawings, specific terminology is employed for the sake of clarity. However, the present invention is not intended to be limited to the specific terminology so selected and it is to be understood that each specific element includes all technical equivalents, which operate in a similar manner.

Referring now to the accompanying drawings; wherein like reference numerals designate identical or corresponding parts throughout the several views or diagrams, and more particularly to FIGS. 1 through 7, there is illustrated an optical writing apparatus according to the present invention including a semiconductor laser array constructed with plural light-emitting elements and a single light-receiving element and plural semiconductor laser drive controlling devices.

Figure 2:
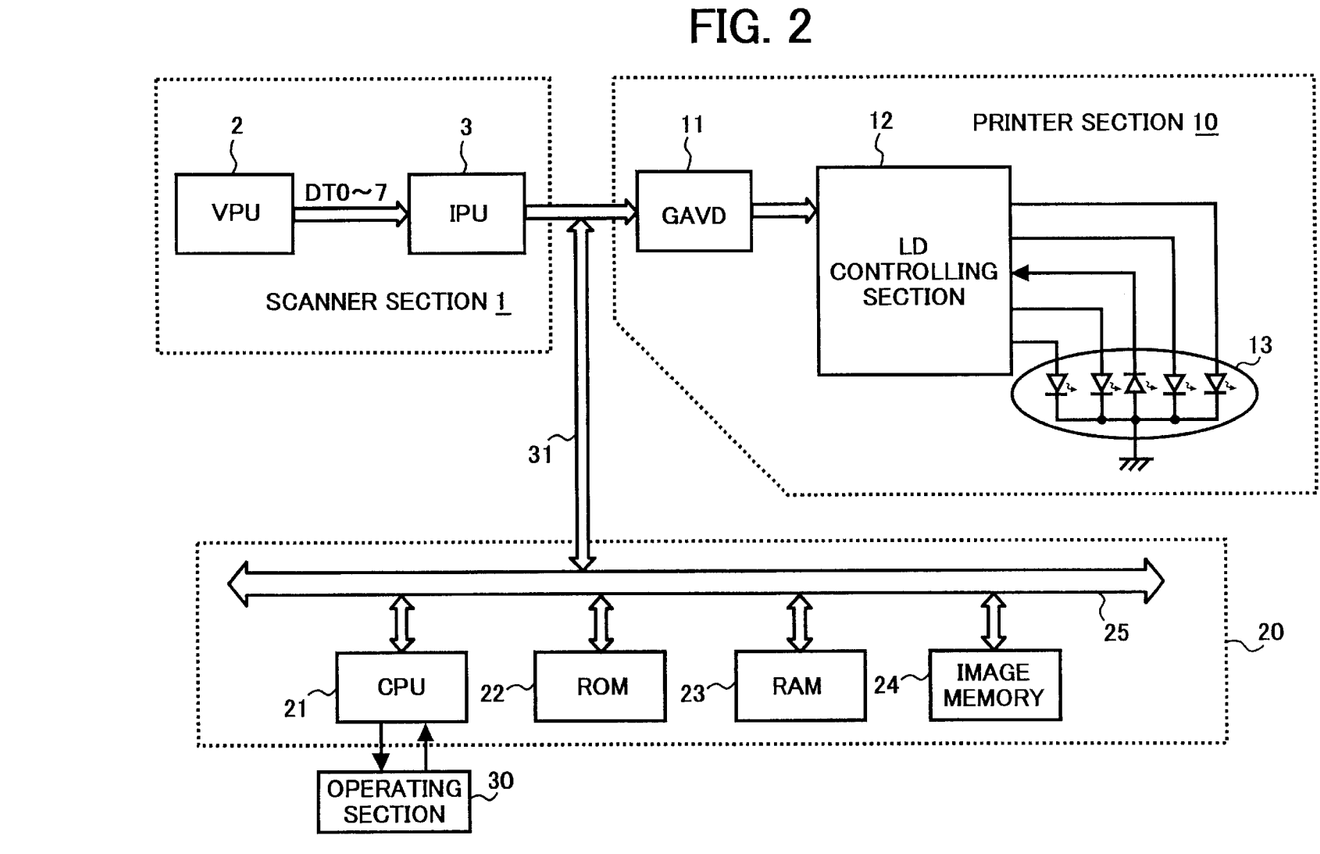
FIG. 2 is a block diagram for illustrating a main part of a digital copying machine including an optical writing apparatus, according to the present invention.

FIG. 2 is a block diagram illustrating an exemplary structure of a digital copying machine, in which the optical writing apparatus of the present invention is installed. The digital copying machine is provided with a scanner section 1 for optically reading out the image on the original document, a printer section 10 for printing and outputting the image information (e.g., image signal) read out by the scanner portion 1, a main control section 20 for controlling the digital copying machine, and an operation board section 30 for providing user input of instructions.

The scanner section 1 is provided with VPU 2 and IPU 3. The VPU 2 converts the electric signal corresponding to the original document image from the CCD sensor (not shown) from analog to digital. In addition, the VPU 2 performs black offset compensation, shading compensation, and pixel position compensation, and outputs the results of such compensation as image information. The IPU 3 practices predetermined image processing on the image information from the VPU 2.

The printer section 10 is provided with a GAVD 11, an LD control section 12, and an LD array 13. The GAVD 11 controls the LD array 13 on the basis of the image information from the IPU 3. The LD array 13 includes plural light-emitting elements (e.g., four elements) and a single light-receiving element, accommodated in a single package. The respective light-emitting elements emit the laser beam (i.e., light beam) respectively modulated in accordance with the image information. The emitted laser beam is radiated onto the surface of a photosensitive body, which is charged by a charger (not shown) via a polygon mirror (not shown), etc. In this way, an electrostatic latent image is formed.

The main control section 20 is provided with CPU 21, ROM 22, RAM 23, and an image memory 24. These sections are coupled to each other via a system bus 25. The scanner section 1, the printer section 10, and the main control section 20 are coupled to each other via the system bus 25 and an interface (I/F) section 31. The CPU 21 is a central processing unit for controlling the main control section 20 in accordance with a control program stored in ROM 22. The ROM 22 is a memory exclusively employed for reading out the information of the control program to be employed by the CPU 21. The RAM 23 is a memory capable of reading and writing the information, which is employed as a work memory at the time of performing data processing by the CPU 21. The image memory 24 is a memory capable of reading and writing, which memorizes the image information from the scanner section 1 per each page.

Figure 1:
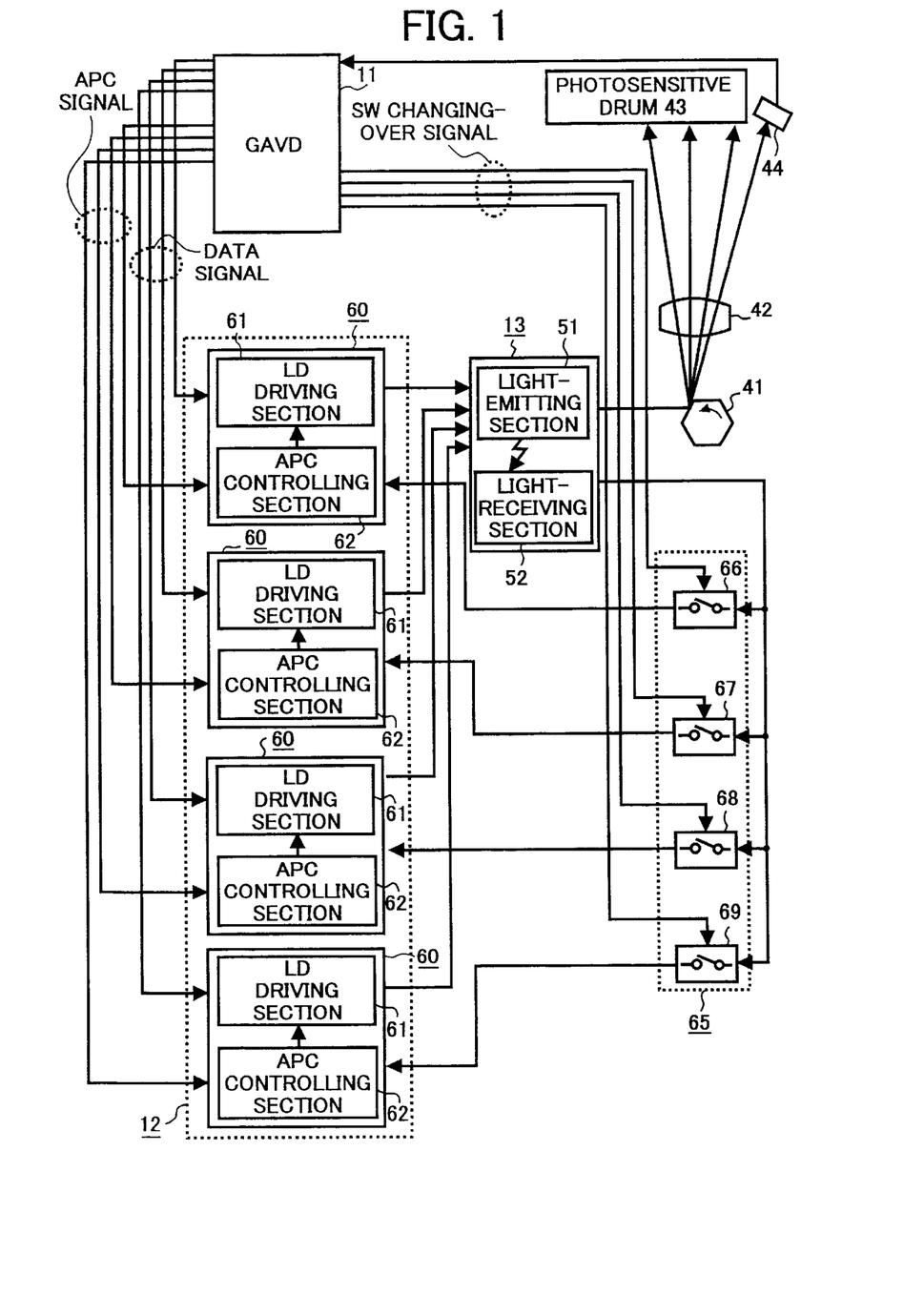
FIG. 1 is a circuit diagram for illustrating a structural example of an optical writing apparatus (e.g., writing unit) in a printer section 10 of FIG. 2, according to the present invention.

FIG. 1 is a construction block diagram illustrating an exemplary structure of a writing apparatus (i.e., writing unit) in a printer section of FIG. 2, according to the present invention. In FIG. 1, the laser beam emitted from the light emitting section 51 of the LD array 13 is collimated by a collimator lens (not shown). The laser beam thus collimated is periodically deflected by a deflector (i.e., a light beam-scanning device) 41 composed of a rotatable polygon mirror. The laser beam thus deflected is focused on the surface of the photosensitive drum 43 uniformly charged by a charger (not shown) by use of an fθ lens 42. The focused light spot is repeatedly moved and scanned in the axis direction of the photosensitive drum 43, namely, in the main scanning direction by the action of the rotation of the deflector 41. The photosensitive drum 43 rotates at the same time.

Since the LD array 13 includes the light-emitting section 51 composed of, for example, four light-emitting elements, four lines of laser beam radiation orbits having the pitch (i.e., position difference) in the sub-scanning direction (i.e., rotational direction of the photosensitive drum 43) are drawn on the surface of the photosensitive drum 43. In this way, the electrostatic latent image is formed on the surface of the photosensitive drum 43 by the action of the laser beam radiation. The electrostatic latent image formed thereon is developed via toner from a developing device (not shown), and thereby a toner image is formed. The formed toner image is transferred onto the transfer paper fed by a paper-feeding device (not shown) by use of a transferring device (not shown).

With the above structure, since the laser beam immediately before scanning the surface of the photosensitive drum 43 passes through a light detector 44 (i.e., synchronization detecting signal generating device) composed of the light-receiving element, such as a photodiode, etc., mounted on the area outside of the main scanning writing area (i.e., outside of the predetermined main scanning width) on the photosensitive drum 43, the light detector 44 detects the laser beam, and creates and outputs the synchronization detecting signal for performing the positioning operation in the main scanning direction (i.e., namely, prescribing the position for starting the writing operation in the main scanning direction).

The GAVD 11 is a device for providing output timing. The GAVD 11 also respectively determines the output timing for outputting four image signals (i.e., DATA signals) to the four LD drive controlling circuits 60 (i.e., semiconductor laser drive controlling devices) in the LD control section 12. The GAVD 11 also provides the output timing for outputting the SW changing-over signal to the changing-over switch circuit 65, and the output timing for outputting the APC signal (i.e., control starting signal) to the APC controlling sections 62 of the respective LD drive controlling circuit 60. The above-noted signals are output with a respective timing thus determined.

The respective LD drive controlling circuits 60 are respectively constructed with the LD drive section 61 and the APC controlling section 62. The LD drive sections 61 in the respective LD drive controlling circuits 60 simultaneously drive the respective light-emitting elements of the light-emitting section 51 in the LD array 13 in accordance with the image signal from the GAVD 11. The sections 61 also cause the light-emitting elements to respectively emit the laser beam from the respective light-emitting elements. In the same way, the light writing operation per each of the plural lines is performed at the same time on the surface of the photosensitive drum 43 and thereby the electrostatic latent image is formed.

The laser beam emitted from the light-emitting element 51 is directed as incident light on the light-receiving section composed of a light-receiving element, such as a photodiode, etc. The light-receiving section 52 detects the light intensity (i.e., light-emitting level of the light-emitting element) of the laser beam thus directed as the incident light. The incident laser beam is the beam emitted in order from the respective light-emitting elements in the light-emitting section 51 at a time of an APC operation. The light-receiving section 52 outputs the light-receiving signal corresponding thereto to the APC controlling section 62 of either one of the LD drive controlling circuits 60 through a changing-over switch device. The APC controlling section 62 signals the APC controlling section in the LD drive controlling circuits 60 having the LD drive section 61, causing the corresponding light-emitting element to emit the light at such a time.

The changing-over switch circuit 65 is constructed with four changing-over switches 66–69. Either one of the changing-over switches 66–69 is selectively turned on (i.e., placed in an ON state) by the switch changing-over signal from the GAVD 11. Thereby, it is possible to change over the construction of the negative feedback loop (i.e., optoelectronic negative feedback loop) of either one of the LD drive controlling circuits 60 for the light-receiving signal output from the light-receiving section 52 of the LD array 13.

The APC controlling section 62 in the respective LD drive controlling circuits 60 controls the LD drive section 61 in accordance with the input light-receiving signal. The APC controlling section 62 further controls the light-emitting level of the corresponding light-emitting element in the light-emitting sections 51 of the LD arrays 13, so as to make the light-emitting level constant. Namely, an APC operation is performed. In such an APC operation, the normal-direction current flowing through the light-emitting element is controlled so as to equalize the light-receiving signals, to be input corresponding to the light-emitting elements, to the light-emitting level designating signal. At this time, the voltage of the drive power source of the corresponding light-emitting element in the LD array 13 is adjusted and held, such that the light-emitting level becomes constant. Namely, the corresponding light-receiving signal and the light-receiving level are respectively equalized.

Figure 3:
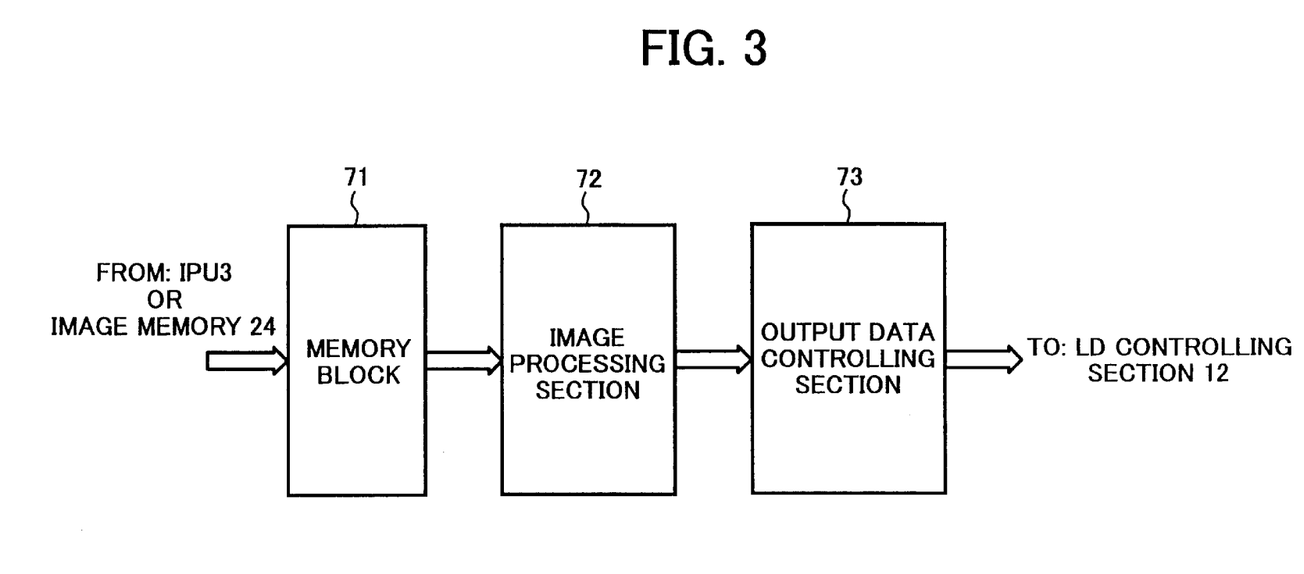
FIG. 3 is a block diagram for illustrating a structural example of a GAVD device 11 of FIG. 1, according to the present invention.

FIG. 3 is a block diagram for illustrating a structural example of the GAVD 11 device of FIG. 1. In FIG. 3, the GAVD 11 is provided with a memory block 71 for practicing the speed conversion and the format conversion for the data (i.e., image signal) from the IPU 3 or the image memory 24. The GAVD 11 further includes an image processing section 72 for practicing a predetermined image processing operation on the data from the memory block 71. The GAVD 11 further includes an output data controlling section 73 for performing processes, such as the γ-conversion, P sensor pattern applying, etc.

Figure 4:
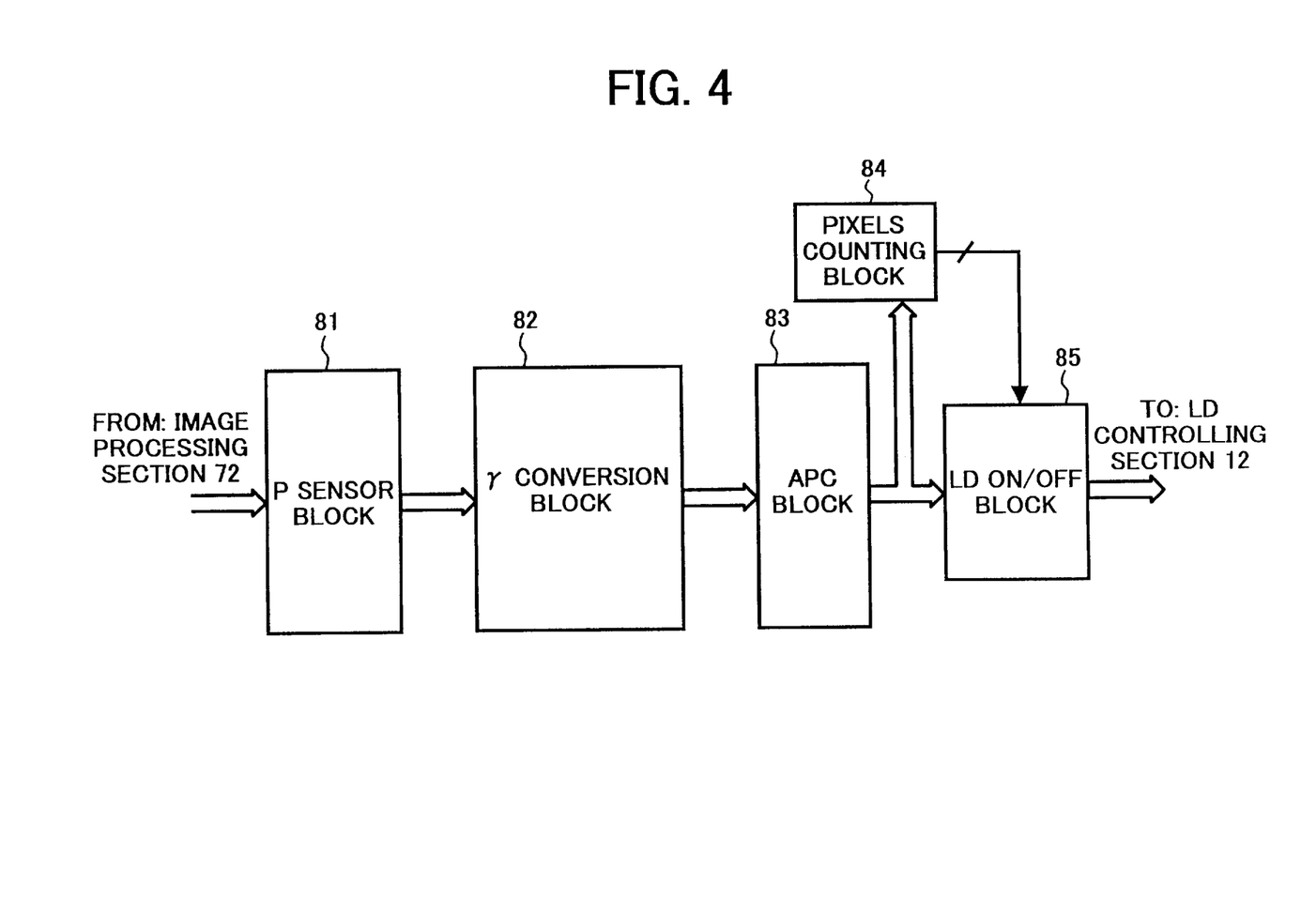
FIG. 4 is a block diagram for illustrating a structural example of an output data controlling section 73 of FIG. 3, according to the present invention.

FIG. 4 is a block diagram illustrating a structural example of the output data controlling section 73 of FIG. 3. In FIG. 4, the output data controlling section 73 is provided with a P sensor block 81 for applying a P sensor pattern. The P sensor pattern is used for putting the toner of a predetermined constant density on the photosensitive drum 43 and for the purpose of acquiring data for determining the processing condition to the data input from the image processing section 72. The output data controlling section 73 is further provided with a γ-conversion block 82 for causing the weight of the data to vary.

The output data controlling section 73 is further provided with an APC block 83 for applying the image signal in synchronism with the APC operation timing. This is done in order to keep constant the light intensity (i.e., light amount) of the laser beam emitted from the respective light-emitting elements of the light emitting section 51 in the LD array 13. A pixel count block 84 is provided for counting the number of the light-emitting dots (i.e., light-emitting pixels) emitted from the respective light-emitting sections 51 in the LD array 13. An LD ON/OFF block 85 is provided for applying the light-emitting data for the synchronization detecting output.

Figure 5:
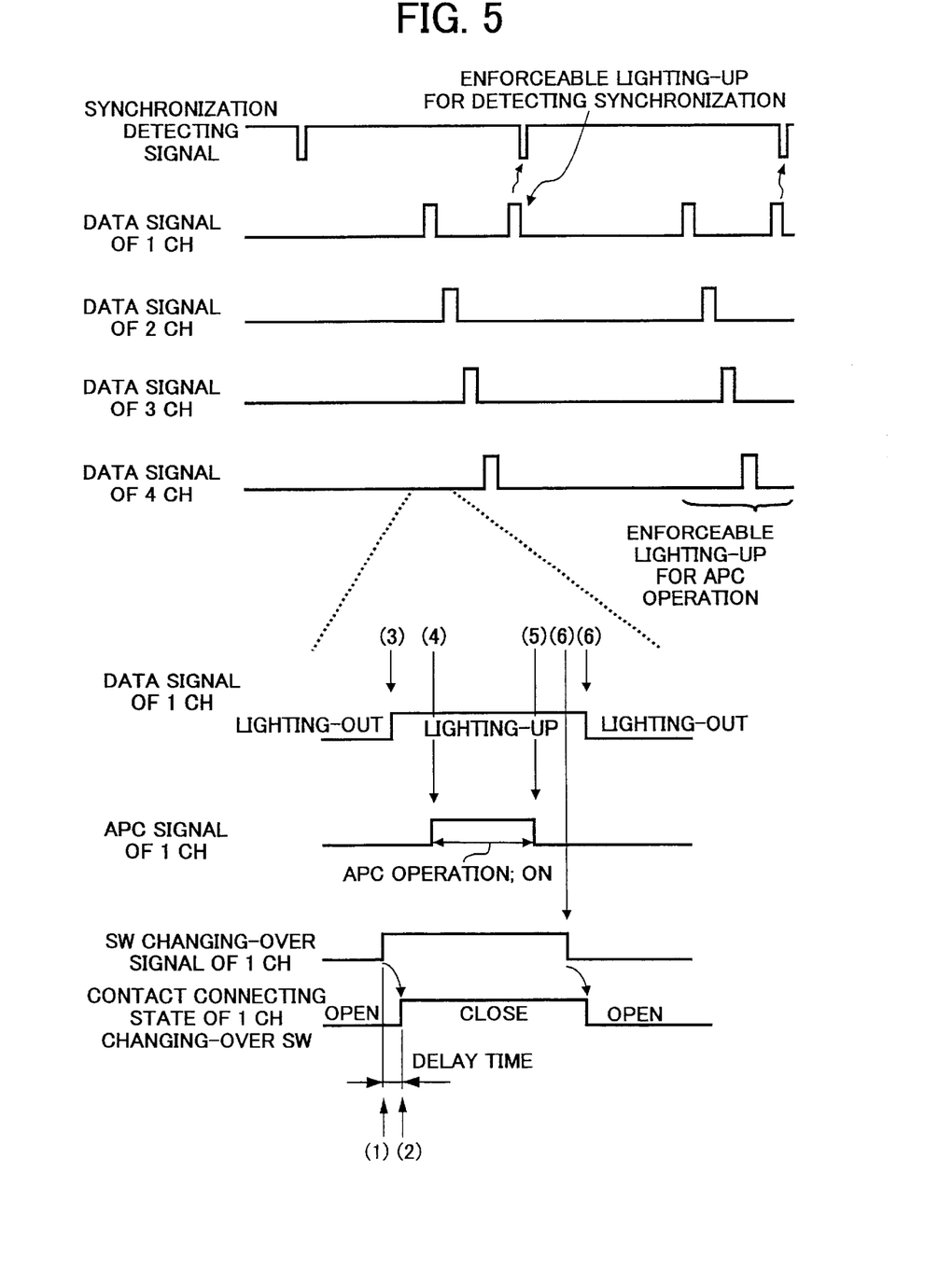
FIG. 5 is a timing chart for illustrating an operational example of the printer section 10 of FIG. 2, according to the present invention.

FIG. 5 is a timing chart for illustrating an exemplary operation of the printer section 10, according to the present invention. Although FIG. 5 shows the APC operation during the time period of waiting, the timing of the APC operation does not change at all, even during the time period of waiting for image formation). The APC operation is performed on the, for example, four CH light emitting elements (i.e., four LDs) per one main scanning operation.

The present invention further includes the following features with respect to FIG. 5:

(1) When the APC operation is performed for either one of the light-emitting elements (i.e., in the one CH light-emitting element embodiment) among all respective light-emitting elements in the light-emitting section 51 of the LD array 13, the GAVD 11 in the printer section 10 forms a negative feedback loop. With such a structure, the switch changing-over signal is output to the changing-over switch 66 in order to perform the changing-over operation. At this time, the changing-over switch 66 is turned on.

(2) Since analog switches are employed as the changing-over switches 66–69, after the GAVD 11 outputs the switch changing-over signal to the changing-over switch 66, the changing-over switch 66 is closed, when the operational delay time (e.g., about 150 ns) of the changing-over switch 66 elapses. At this time, an actual negative feedback loop is constructed by the light-receiving signal output from the light receiving section 32 in the LD array 13.

(3) Before the APC signal is output to the APC control section 62 of the one CH LD drive controlling circuit 60 (i.e., the circuit 60 causes the APC control section 62 to start the APC operation.), the image signal (i.e., DATA signal) employed for operating the APC action is output to the LD drive section 61 in the LD drive controlling circuit 60. At this time, the LD drive controlling circuit 60 outputs the image signal (i.e., DATA signal) for use in the APC operation, to the LD drive section 61 in the LD drive control circuit 60, and starts the enforceable lighting-up of the one CH light-emitting element of the light-emitting section 51 in the LD array 13.

(4) The enforceable lighting-up of the one CH light-emitting element is started, and after the negative feedback loop is formed by the action of the changing-over operation of the changing-over switch circuit 65 (i.e., after at least the time corresponding to the operational delay time of the changing-over switch 66 elapses), the APC signal (i.e., control starting signal) is output to the APC control section 62 in the one CH LD drive control circuit 60, and the APC operation is started at this time. This is the processing relating to the first aspect of the present invention.

(5) The output operation for outputting the APC signal to the APC control section 62 in the one CH LD drive controlling circuit 60 is stopped. At this time, the APC controlling section 62 causes the APC operation to finish.

(6) After finishing the APC operation by use of the APC controlling section 62 in the one CH LD drive controlling circuit 60, the outputting of the switch changing-over signal to the changing over switch 66 of the changing-over switch circuit 65 is stopped at this time. The changing-over switch 66 thus is opened (i.e., the negative feedback loop is released). In addition, the outputting of the image signal (i.e., DATA signal) for the APC operation to the APC controlling section 62 in the one CH LD drive controlling circuit 60 is stopped. The enforceable lighting-up of the one CH light-emitting element in the light emitting section 51 of the LD array 13 thus is released. This is the processing relating to the second aspect of the present invention.

In addition, the output timing of the above-noted signals by use of the GAVD 11 is cleared by the synchronization detecting signal employed in the GAVD 11. The same output timing is created by use of a main scanning counter (not shown), in which the counting-up operation is performed by a writing clock CLK. During operation, when the count values previously reach some value, the state of whether the respective signals are output (i.e., the signals are respectively turned on) or stopped (i.e., the signals are respectively turned off) is selectively set in advance. As such, the setting of the outputting or stopping of the respective signals is selectively performed by comparing the aforementioned count values with those respective preset values. The setting values can be changed at the time of setting the various setting data to a special (i.e., particular) mode capable of changing the setting data, which is called the SP (Serviceman Program) Mode, by use of the operation signal from the operation board section 30.

Although analog switches are respectively employed as the changing-over switches 66–69 in the present invention, devices capable of optionally opening/closing the contacts of a relay, etc., may be used. However, since the delay times are different from each other according to the parts employed, it is necessary to prepare the setting data of the operational timing so as to be fitted to the devices employed.

Figure 6:
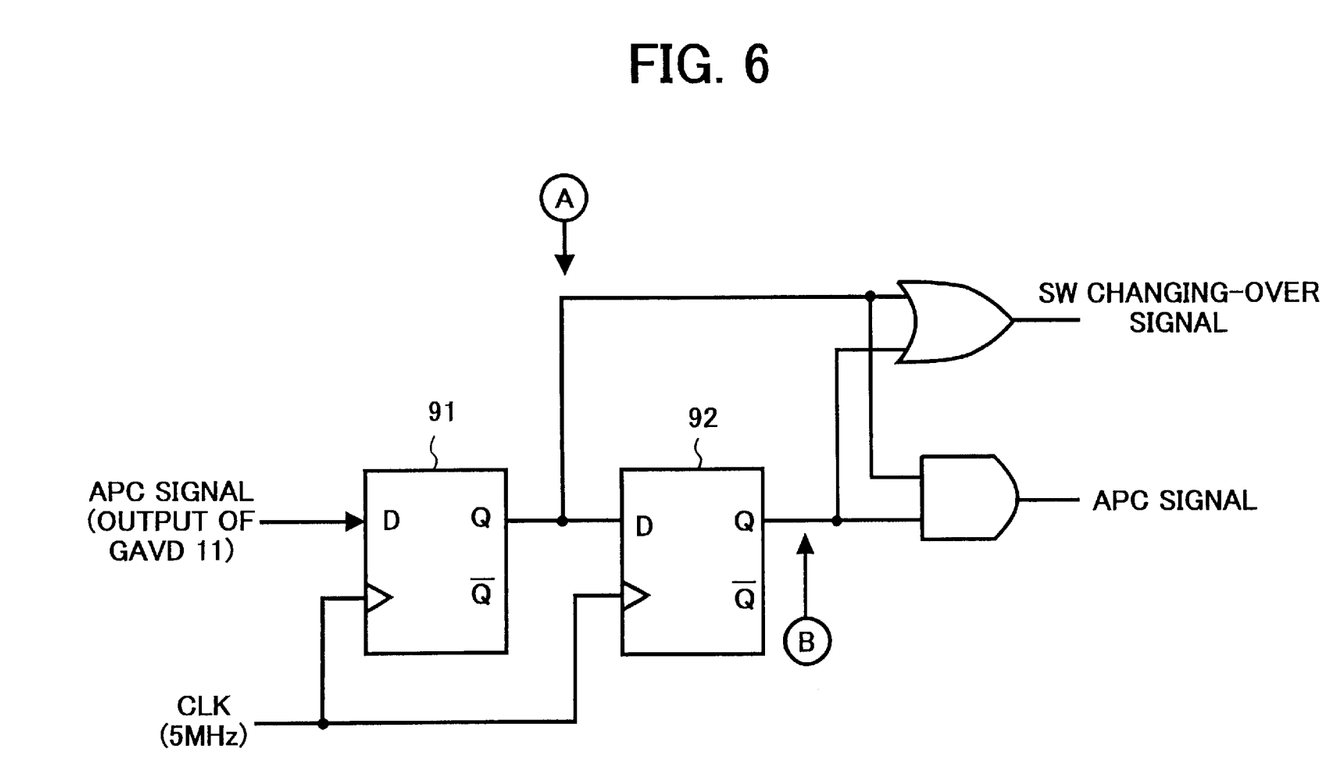
FIG. 6 is a block diagram for illustrating a structural example of a combinatorial circuit for creating a switching (SW) changing-over signal employed in a case wherein the GAVD device 11 of FIG. 1 cannot create the SW changing-over signal due to the limitation of the number of pins thereof, etc., according to the present invention.

In addition, it is typically necessary to separately prepare the switch changing-over signals for both of the image signal (i.e., DATA signal) and the APC signal. However, in case that the GAVD 11 cannot create the switch changing-over signal because of the limitation of the number pins thereof, etc., a circuit such as shown in FIG. 6 may be employed. In FIG. 6, the APC signal and the switch changing-over signal can be newly created separately from the APC signal by providing the combination of plural digital circuits including two flip-flop circuits 91 and 92.

Figure 7:
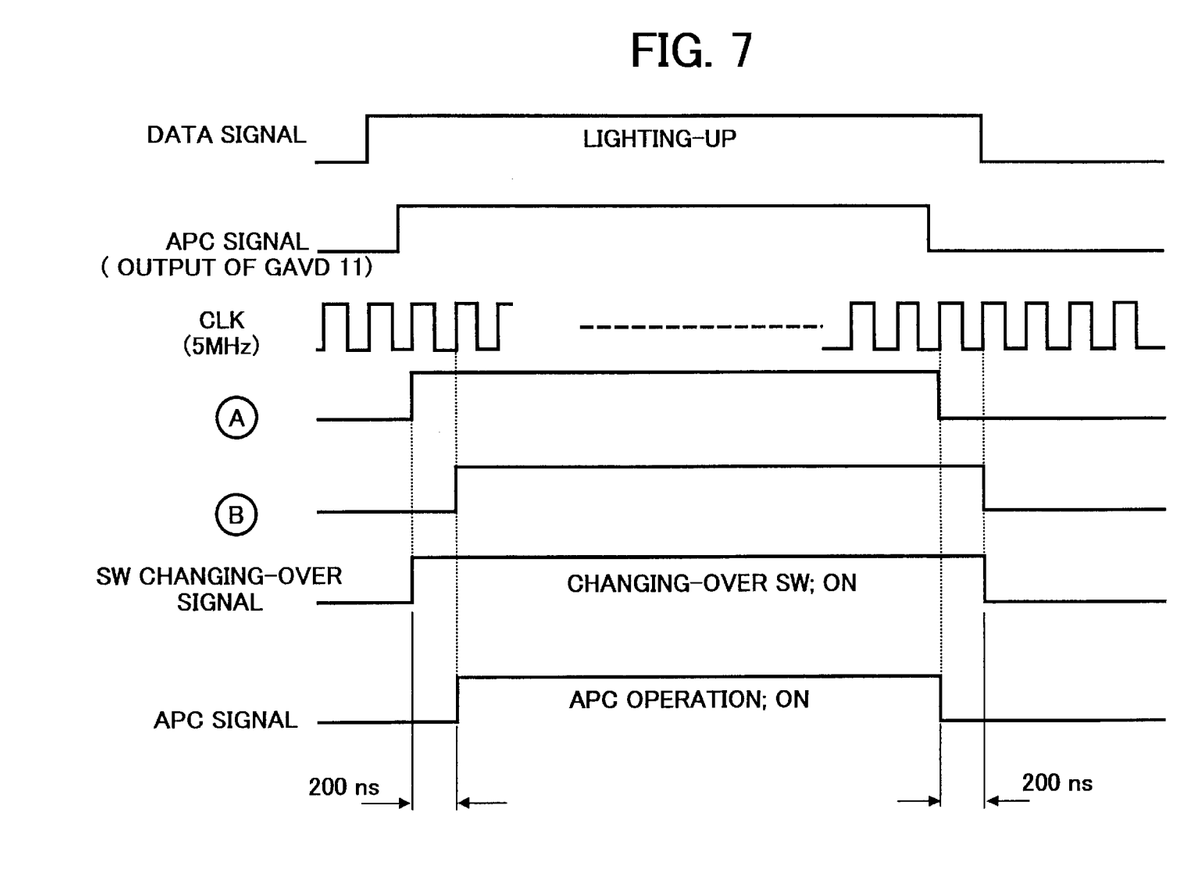
FIG. 7 is a timing chart for illustrating an output timing example of respective signals of the combinatorial circuit of FIG. 6 and the GAVD device 11 of FIG. 1, according to the present invention.

FIG. 7 shows an example of the output timing of the respective signals in the GAVD 11 and the above-mentioned combination circuit. The embodiment applied to the optical writing apparatus employing the LD array carried on the digital copying machine according to the present invention has been described. However, the present invention is not limited to the above-mentioned embodiments. The invention is applicable to the optical writing apparatus employing the LD array capable of being carried on the other electrophotographic image forming apparatus, such as laser printer, facsimile device, etc.

As described above, the apparatus of the present invention is provided with a changing-over switch device capable of changing over either one of the semiconductor laser drive controlling devices (i.e., commonly-used LD drive controlling circuits including the APC function). The light-receiving signal output from the light-receiving element of the semiconductor laser array is constructed as a negative feedback loop of either one of the semiconductor laser drive controlling devices. The apparatus is further provided with an output timing determining device for respectively determining the timing for outputting the changing-over signal to the changing-over switch device and the timing for outputting the control starting signal to the current controlling device of the respective semiconductor laser drive controlling device. With such a structure, the LD drive controlling circuit (i.e., LD driver) including the commonly used APC function can be used. By employing the LD drive IC, the entire control circuit can be simplified, the base board carrying the entire control circuit can be reduced in size, and the negative feedback loop can be shortened. Consequently, the respective light-emitting elements of the semiconductor laser array can perform a further stable drive operation.

The output timing determining device outputs the changing-over signal to the changing-over switch device. After at least the time period corresponding to the operational delay time of the changing-over switch device elapses from that time point, the output timing determining device further outputs the control starting signal to the current controlling device (i.e., a portion performing the APC operation) of the semiconductor laser drive controlling device connected to the negative feedback loop formed by the changing-over action of the changing-over switch device. With such a structure, it is possible to avoid performing the APC operation when the light-receiving signal (i.e., the feedback current) is cut off or intercepted. Consequently, the excessive light emission from the light-emitting element can be prevented.

In addition, the apparatus according to the present invention is provided with a changing-over switch device capable of changing over either one of the semiconductor laser drive controlling devices (i.e., commonly-used LD drive controlling circuits including the APC function). The light-receiving signal output from the light-receiving element of the semiconductor laser array is constructed as the negative feedback loop of either one of the semiconductor laser drive controlling devices. The apparatus is further provided with an output timing determining device for respectively determining the timing for outputting the changing-over signal to the changing-over switch device and the timing for outputting the control starting signal to the current controlling device of the respective semiconductor laser drive controlling device. With such a structure, the LD drive controlling circuit (LD driver) including the commonly used APC function can be used. By employing the LD drive IC, the entire control circuit can be simplified, the baseboard carrying the entire control circuit can be reduced in size, and the negative feedback loop can be shortened. Consequently, the respective light-emitting elements of the semiconductor laser array can perform a further stable drive operation.

Furthermore, after finishing the control operation performed by the current controlling device in the semiconductor laser drive controlling device connected to the negative feedback loop formed by the changing-over action of the changing-over switch device among the current controlling device (i.e., portion of performing the APC operation) of the respective semiconductor laser drive controlling devices, the output timing determining device stops the outputting of the changing-over signal to the changing-over switch device. As a result, it is possible to avoid that the light-receiving signal (i.e., feedback current) from the light-receiving element is cut off (i.e., intercepted) during the time period of the APC operation. Consequently, the excessive light-emission from the light-emitting element can be prevented.

According to the optical writing apparatus of the present invention, the output timing determining device performs the same controlling operation as that of the first aspect of the invention. In addition, after finishing the control operation performed by the current controlling device in the semiconductor laser drive controlling device connected to the negative feedback loop formed by the changing-over action of the changing-over switch device among the current controlling device (i.e., the portion of performing the APC operation) of the respective semiconductor laser drive controlling devices, the output timing determining device stops outputting of the changing-over signal to the changing-over switch device. As a result, it is possible to avoid that the light-receiving signal (i.e., feedback current) from the light-receiving element is cut off (i.e., intercepted) during the time period of the APC operation. Consequently, the excessive light emission from the light-emitting element can be prevented.

The mechanisms and processes set forth in the present invention may be implemented using one or more conventional general purpose microprocessors and/or signal processors programmed according to the teachings in the present specification, as will be appreciated by those skilled in the relevant art(s). Appropriate software coding can readily be prepared by skilled programmers based on the teachings of the present disclosure, as will also be apparent to those skilled in the relevant art(s). However, as will be readily apparent to those skilled in the art, the present invention also may be implemented by the preparation of application-specific integrated circuits, by interconnecting an appropriate network of conventional component circuits or by a combination thereof with one or more conventional general purpose microprocessors and/or signal processors programmed accordingly.

The present invention thus also includes a computer-based product which may be hosted on a storage medium and include instructions which can be used to program a microprocessor to perform a process in accordance with the present invention. This storage medium can include, but is not limited to, any type of disk including floppy disks, optical disks, CD-ROMs, magneto-optical disks, ROMs, RAMs, EPROMs, EEPROMs, flash memory, magnetic or optical cards, or any type of media suitable for storing electronic instructions.

Numerous additional modifications and variations of the present invention are possible in light of the above teachings. It is therefore to be understood that within the scope of the appended claims, the present invention may be practiced otherwise than as specifically described herein.

What is claimed as new and desired to be secured by Letter Patent of the United States is:

1. An optical writing apparatus, comprising:
    a semiconductor laser array constructed with plural light-emitting elements and a single light-receiving element; and
    plural semiconductor laser drive controlling devices respectively and simultaneously driving said plural light-emitting elements in said semiconductor laser array and thereby causing said light-emitting elements to perform the optical writing operation at the same time per each of plural lines,
    wherein said plural semiconductor laser drive controlling devices respectively comprise:
        a current controlling device controlling the normal-direction currents flowing through said respective plural light-emitting elements, such that light-receiving signals corresponding to light-emitting levels of said respective light-emitting elements output from said light-receiving element in said semiconductor laser array and the light-emitting level designating signals respectively become equal to each other;
    said optical writing apparatus further comprises:
        a change-over switching device capable of changing over said plural semiconductor laser drive controlling devices to either one of them as a negative feedback loop, to which the light-receiving signal outputted from said light-receiving element in said semiconductor laser array is applied; and
        an outputting timing determination device respectively determining an outputting timing of outputting the change-over signal to said change-over switching device and another outputting timing of outputting the control starting signal to said current controlling device in said respective semiconductor laser drive controlling devices, and
        said outputting timing determination device further comprises:
            an outputting device outputting the change-over signal to said change-over switching device and outputting the control starting signal to said current controlling device in said semiconductor laser drive controlling device connected to said negative feedback loop formed by the changing-over operation of said change-over switching device, after at least the time corresponding to an operation delaying time of said change-over switching device elapses from that time point.

2. The optical writing apparatus as defined in claim 1, wherein said outputting timing determination device further comprises:
    an outputting stopping device stopping the outputting of the change-over signal to said change-over switching device, after finishing the control operation by use of said current controlling device in said semiconductor laser drive controlling device connected to the negative feedback loop formed by the changing-over operation of said change-over switching device among said current controlling devices in said respective semiconductor laser drive controlling devices.

3. An optical writing apparatus, comprising:
    a semiconductor laser array constructed with plural light-emitting elements and a single light-receiving element; and
    plural semiconductor laser drive controlling devices respectively and simultaneously driving said plural light-emitting elements in said semiconductor laser array and thereby causing said light-emitting elements to perform the optical writing operation at the same time per each of plural lines,
    wherein said plural semiconductor laser drive controlling devices respectively comprise:
        a current controlling device controlling the normal-direction currents flowing through said respective plural light-emitting elements, such that light-receiving signals corresponding to light-emitting levels of said respective light-emitting elements outputted from said light-receiving element in said semiconductor laser array and the light-emitting level designating signals respectively become equal to each other,
    said optical writing apparatus further comprises:
        a change-over switching device capable of changing over said plural semiconductor laser drive controlling devices to either one of them as a negative feedback loop, to which the light-receiving signal outputted from said light-receiving element in said semiconductor laser array is applied; and
        an outputting timing determination device respectively determining an outputting timing of outputting the change-over signal to said change-over switching device and another outputting timing of outputting the control starting signal to said current controlling device in said respective semiconductor laser drive controlling devices, and
        said outputting timing determination device further comprises:
            an outputting stopping device stopping the outputting of the change-over signal to said change-over switching device, after finishing the control operation by use of said current controlling device in said semiconductor laser drive controlling device connected to the negative feedback loop formed by the changing-over operation of said change-over switching device among said current controlling devices in said respective semiconductor laser drive controlling device.

4. An optical writing apparatus comprising:

semiconductor laser array means for providing image data, the semiconductor laser array means including plural light-emitting elements and a single light-receiving element; and plural semiconductor laser drive controlling means for respectively and simultaneously driving said plural light-emitting elements in said semiconductor laser array means and thereby causing said light-emitting elements to perform the optical writing operation at the same time per each of plural lines, wherein said plural semiconductor laser drive controlling means respectively comprise:

current controlling means for controlling the normal-direction currents flowing through said respective plural light-emitting elements, such that light-receiving signals corresponding to light-emitting levels of said respective light-emitting elements outputted from said light-receiving element in said semiconductor laser array means and the light-emitting level designating signals respectively become equal to each other, said optical writing apparatus further comprises:

change-over switching means capable of changing over said plural semiconductor laser drive controlling means to either one of them as a negative feedback loop, to which the light-receiving signal outputted from said light-receiving element in said semiconductor laser array means; and outputting timing determination means for respectively determining an outputting timing of outputting the change-over signal to said change-over switching means and another outputting timing of outputting the control starting signal to said current controlling means in said respective semiconductor laser drive controlling means, and said outputting timing determination means further comprises:

outputting means for outputting the change-over signal to said change-over switching means and outputting the control starting signal to said current controlling means in said semiconductor laser drive controlling means connected to said negative feedback loop formed by the changing-over operation of said change-over switching means, after at least the time corresponding to an operation delaying time of said change-over switching means elapses from that time point.

5. The optical writing apparatus as defined in claim 4, wherein said outputting timing determination device further comprises:

outputting stopping means for stopping the outputting of the change-over signal to said change-over switching means, after finishing the control operation by use of said current controlling means in said semiconductor laser drive controlling means connected to the negative feedback loop formed by the changing-over operation of said change-over switching means among said current controlling means in said respective semiconductor laser drive controlling means.

6. An optical writing apparatus, comprising:

semiconductor laser array means for providing image data, the semiconductor laser array means including plural light-emitting elements and a single light-receiving element; and plural semiconductor laser drive controlling means for respectively and simultaneously driving said plural light-emitting elements in said semiconductor laser array means and thereby causing said light-emitting elements to perform the optical writing operation at the same time per each of plural lines, wherein said plural semiconductor laser drive controlling means respectively comprise:

current controlling means for controlling the normal-direction currents flowing through said respective plural light-emitting elements, such that light-receiving signals corresponding to light-emitting levels of said respective light-emitting elements outputted from said light-receiving element in said semiconductor laser array means and the light-emitting level designating signals respectively become equal to each other, said optical writing apparatus further comprises:

change-over switching means capable of changing over said plural semiconductor laser drive controlling means to either one of them as a negative feedback loop, to which the light-receiving signal outputted from said light-receiving element in said semiconductor laser array means; and outputting timing determination means for respectively determining an outputting timing of outputting the change-over signal to said change-over switching means and another outputting timing of outputting the control starting signal to said current controlling means in said respective semiconductor laser drive controlling means, and said outputting timing determination means further comprises:

outputting stopping means for stopping the outputting of the change-over signal to said change-over switching means, after finishing the control operation by use of said current controlling means in said semiconductor laser drive controlling means connected to the negative feedback loop formed by the changing-over operation of said change-over switching means among said current controlling means in said respective semiconductor laser drive controlling mean.

7. A method for optically writing an image, comprising the steps of:

preparing a semiconductor laser array constructed with plural light-emitting elements and a single light-receiving element;

respectively and simultaneously driving said plural light-emitting elements in said semiconductor laser array and thereby causing said light-emitting elements to perform the optical writing operation at the same time per each of plural lines, by use of plural semiconductor laser drive controlling devices;

controlling the normal-direction currents flowing through said respective plural light-emitting elements such that light-receiving signals corresponding to light-emitting levels of said respective light-emitting elements outputted from said light-receiving element in said semiconductor laser array and the light-emitting level designating signals respectively become equal to each other, by use of a current controlling device is applied;

changing over said plural semiconductor laser drive controlling devices to either one of them as a negative feedback loop, to which the light-receiving signal outputted from said light-receiving element in said semiconductor laser array by use of a change-over switching device is applied;

respectively determining an outputting timing of outputting the change-over signal to said change-over switching device and another outputting timing of outputting the control starting signal to said current controlling device in said respective semiconductor laser drive controlling devices, by use of an outputting timing determination device; and outputting the change-over signal to said change-over switching device and outputting the control starting signal to said current controlling device in said semiconductor laser drive controlling device connected to said negative feedback loop formed by the changing-over operation of said change-over switching device, after at least the time corresponding to an operation delaying time of said change-over switching device elapses from that time point.

8. The method of optically writing the image as defined in claim 7, further comprising the step of:

stopping the outputting of the change-over signal to said change-over switching device, after finishing the control operation by use of said current controlling device in said semiconductor laser drive controlling device connected to the negative feedback loop formed by the changing-over operation of said change-over switching device among said current controlling devices in said respective semiconductor laser drive controlling devices.

9. A computer program product including a computer program configured to perform the steps recited in any one of claims 7 to 8.

10. A method of optically writing the image, comprising the steps of:

preparing a semiconductor laser array constructed with plural light-emitting elements and a single light-receiving element;

respectively and simultaneously driving said plural light-emitting elements in said semiconductor laser array and thereby causing said light-emitting elements to perform the optical writing operation at the same time per each of plural lines, by use of plural semiconductor laser drive controlling devices;

controlling the normal-direction currents flowing through said respective plural light-emitting elements such that light-receiving signals corresponding to light-emitting levels of said respective light-emitting elements outputted from said light-receiving element in said semiconductor laser array and the light-emitting level designating signals respectively become equal to each other, by use of a current controlling device is applied;

changing over said plural semiconductor laser drive controlling devices to either one of them as a negative feedback loop, to which the light-receiving signal outputted from said light-receiving element in said semiconductor laser array by use of a change-over switching device is applied;

respectively determining an outputting timing of outputting the change-over signal to said change-over switching device and another outputting timing of outputting the control starting signal to said current controlling device in said respective semiconductor laser drive controlling devices, by use of an outputting timing determination device; and stopping the outputting of the change-over signal to said change-over switching device, after finishing the control operation by use of said current controlling device in said semiconductor laser drive controlling device connected to the negative feedback loop formed by the changing-over operation of said change-over switching device among said current controlling devices in said respective semiconductor laser drive controlling device, by use of an outputting stopping device.

* * * * *